(12) United States Patent
Kyles et al.

(10) Patent No.: US 10,797,916 B2
(45) Date of Patent: Oct. 6, 2020

(54) EHF RECEIVER ARCHITECTURE WITH DYNAMICALLY ADJUSTABLE DISCRIMINATION THRESHOLD

(71) Applicant: Keyssa, Inc., Campbell, CA (US)

(72) Inventors: Ian A. Kyles, West Linn, OR (US); Norbert Seitz, Portland, OR (US)

(73) Assignee: Keyssa, Inc., Campbell, CA (US)

( * ) Notice: Subject to any disclaimer, the term of this patent is extended or adjusted under 35 U.S.C. 154(b) by 0 days.

(21) Appl. No.: 16/275,190

(22) Filed: Feb. 13, 2019

(65) Prior Publication Data

US 2020/0014567 A1 Jan. 9, 2020

Related U.S. Application Data

(63) Continuation of application No. 15/226,728, filed on Aug. 8, 2016, now Pat. No. 10,250,418.

(51) Int. Cl.
*H04L 25/06* (2006.01)
*H04L 25/02* (2006.01)
*H03G 3/30* (2006.01)

(52) U.S. Cl.
CPC ........ *H04L 25/069* (2013.01); *H04L 25/0266* (2013.01); *H04L 25/0272* (2013.01); *H04L 25/063* (2013.01); *H03G 3/3089* (2013.01); *H04L 25/026* (2013.01)

(58) Field of Classification Search
CPC . H04L 25/063; H04L 25/069; H04L 25/0266; H04L 25/0272
See application file for complete search history.

(56) References Cited

U.S. PATENT DOCUMENTS 3,793,486 A * 2/1974 Koziol .................... H04L 27/10
379/93.31
3,947,769 A * 3/1976 Rousos ................. H04L 27/148
375/318
4,013,965 A * 3/1977 Scharfe, Jr. ............... H04L 1/04
375/334

(Continued)

FOREIGN PATENT DOCUMENTS

WO  WO 2013/130486 A1  9/2013
WO  WO-2014145366 A2 * 9/2014 ............... H04B 1/04

OTHER PUBLICATIONS

United States Office Action, U.S. Appl. No. 15/226,728, dated Jan. 24, 2018, 18 pages.

(Continued)

*Primary Examiner* — Berhanu Tadese
(74) *Attorney, Agent, or Firm* — Fenwick & West LLP

(57) ABSTRACT

An EHF receiver that determines an initial slicing voltage level and dynamically adjusts the slicing voltage level and/or amplifier gain levels to account for characteristics of the received EHF electromagnetic data signal. The architecture includes an amplifier, detector, adaptive signal slicer, and controller. The detector includes a main detector and replica detector that convert the received EHF electromagnetic data signal into a baseband signal and a reference signal. The controller uses the baseband signal and reference signal to determine an initial slicing voltage level, and dynamically adjust the slicing voltage level and the gain settings of the amplifier to compensate for changing signal conditions.

20 Claims, 6 Drawing Sheets

(56) References Cited

U.S. PATENT DOCUMENTS

| | | | |
|---|---|---|---|
| 5,020,411 A * | 6/1991 | Rowan | F02G 1/043 |
| | | | 376/319 |
| 5,777,494 A | 7/1998 | Takahashi | |
| 6,437,641 B1 * | 8/2002 | Bar-David | H03F 1/0222 |
| | | | 330/10 |
| 6,492,867 B2 * | 12/2002 | Bar-David | H03F 1/0222 |
| | | | 330/10 |
| 6,735,260 B1 | 5/2004 | Eliezer et al. | |
| 6,760,372 B1 * | 7/2004 | Zortea | H04L 7/0334 |
| | | | 375/232 |
| 7,356,095 B2 * | 4/2008 | Dagdeviren | H04L 7/033 |
| | | | 375/340 |
| 8,554,136 B2 | 10/2013 | McCormack | |
| 8,811,526 B2 * | 8/2014 | McCormack | H01L 23/66 |
| | | | 327/291 |
| 9,002,308 B1 * | 4/2015 | Zocher | H04N 13/341 |
| | | | 455/234.1 |
| 9,077,386 B1 * | 7/2015 | Holden | H04L 25/0292 |
| 9,264,187 B1 * | 2/2016 | Sosa | H04L 25/03057 |
| 9,407,311 B2 | 8/2016 | McCormack et al. | |
| 9,515,365 B2 | 12/2016 | McCormack et al. | |
| 9,515,859 B2 * | 12/2016 | McCormack | H01L 23/66 |
| 9,521,405 B1 * | 12/2016 | Zocher | H04N 13/0051 |
| 9,654,315 B2 * | 5/2017 | Wei | H04L 25/063 |
| 9,839,103 B2 * | 12/2017 | Avrahamy | H05B 47/19 |
| 9,867,263 B2 * | 1/2018 | Avrahamy | H05B 39/088 |
| 9,888,507 B2 * | 2/2018 | Kyles | H04L 63/0428 |
| 9,929,818 B2 * | 3/2018 | Holden | H04L 1/0041 |
| 9,940,295 B2 * | 4/2018 | Isaac | G06F 13/4282 |
| 10,085,301 B2 * | 9/2018 | Kyles | H04B 5/02 |
| 10,236,938 B2 * | 3/2019 | McCormack | H04L 69/08 |
| 10,250,418 B2 * | 4/2019 | Kyles | H04L 25/0272 |
| 10,270,520 B2 * | 4/2019 | Arapoglou | H04B 7/0452 |
| 10,349,465 B2 * | 7/2019 | Kyles | H04W 12/08 |
| 10,447,366 B2 * | 10/2019 | Levitsky | H04B 7/088 |
| 10,448,586 B2 * | 10/2019 | Avrahamy | C02F 1/42 |
| 2001/0054931 A1 * | 12/2001 | Bar-David | H03F 1/025 |
| | | | 330/10 |
| 2004/0120426 A1 * | 6/2004 | Dagdeviren | H04L 25/061 |
| | | | 375/340 |
| 2004/0190650 A1 | 9/2004 | Khorram et al. | |
| 2004/0196017 A1 | 10/2004 | Sutardja et al. | |
| 2006/0120491 A1 * | 6/2006 | Yen | H04L 25/063 |
| | | | 375/345 |
| 2007/0248192 A1 | 10/2007 | Brunsch et al. | |
| 2010/0153589 A1 | 6/2010 | Maroni et al. | |
| 2012/0121043 A1 | 5/2012 | Wambacq | |
| 2012/0249366 A1 | 10/2012 | Pozgay et al. | |
| 2012/0263244 A1 | 10/2012 | Kyles et al. | |
| 2012/0307932 A1 * | 12/2012 | McCormack | H01Q 1/2283 |
| | | | 375/295 |
| 2013/0058445 A1 * | 3/2013 | Huang | H04L 25/068 |
| | | | 375/355 |
| 2013/0070817 A1 | 3/2013 | McCormack et al. | |
| 2013/0094558 A1 * | 4/2013 | Huang | H04L 7/00 |
| | | | 375/224 |
| 2013/0196598 A1 | 8/2013 | McCormack et al. | |
| 2013/0201316 A1 * | 8/2013 | Binder | H04L 67/12 |
| | | | 348/77 |
| 2013/0241622 A1 * | 9/2013 | Zerbe | H03K 3/013 |
| | | | 327/323 |
| 2013/0257670 A1 | 10/2013 | Sovero et al. | |
| 2013/0266026 A1 * | 10/2013 | McCormack | H04B 5/0031 |
| | | | 370/474 |
| 2013/0266154 A1 * | 10/2013 | McCormack | H04R 3/00 |
| | | | 381/117 |
| 2013/0316653 A1 | 11/2013 | Kyles et al. | |
| 2014/0015582 A1 * | 1/2014 | Huang | H03K 3/356139 |
| | | | 327/211 |
| 2014/0160939 A1 | 6/2014 | Arad et al. | |
| 2014/0169486 A1 * | 6/2014 | McCormack | G06F 1/1626 |
| | | | 375/259 |
| 2014/0170982 A1 * | 6/2014 | McCormack | H04W 8/085 |
| | | | 455/41.2 |
| 2014/0273833 A1 * | 9/2014 | McCormack | H04B 5/0037 |
| | | | 455/41.1 |
| 2014/0273856 A1 * | 9/2014 | Kyles | H04W 12/08 |
| | | | 455/41.2 |
| 2014/0273894 A1 | 9/2014 | McCormack et al. | |
| 2014/0281534 A1 | 9/2014 | McCormack et al. | |
| 2014/0286643 A1 | 9/2014 | George et al. | |
| 2014/0341232 A1 | 11/2014 | McCormack et al. | |
| 2014/0355700 A1 * | 12/2014 | McCormack | H01Q 7/00 |
| | | | 375/259 |
| 2015/0085957 A1 * | 3/2015 | Jing | H04L 25/03057 |
| | | | 375/319 |
| 2015/0280827 A1 * | 10/2015 | Adiletta | H01P 5/00 |
| | | | 398/116 |
| 2015/0288410 A1 * | 10/2015 | Adiletta | H04L 49/10 |
| | | | 455/73 |
| 2015/0381346 A1 * | 12/2015 | Holden | H04L 7/043 |
| | | | 714/775 |
| 2016/0036495 A1 | 2/2016 | McCormack et al. | |
| 2017/0046299 A1 * | 2/2017 | Isaac | G06F 13/4068 |
| 2017/0070373 A1 * | 3/2017 | Wei | H04L 25/063 |
| 2017/0086281 A1 * | 3/2017 | Avrahamy | A01G 7/045 |
| 2017/0149493 A1 * | 5/2017 | Arapoglou | H04B 7/0626 |
| 2017/0265287 A1 * | 9/2017 | Avrahamy | B01D 61/147 |
| 2018/0041235 A1 * | 2/2018 | Kyles | H04L 25/0272 |
| 2018/0069259 A1 * | 3/2018 | McCormack | H04B 5/0037 |
| 2018/0092313 A1 * | 4/2018 | Avrahamy | H05B 47/19 |
| 2018/0139800 A1 * | 5/2018 | Kyles | H04L 63/0876 |
| 2018/0196775 A1 * | 7/2018 | Isaac | H04B 1/40 |
| 2018/0269947 A1 * | 9/2018 | Levitsky | H04B 7/0695 |
| 2018/0324689 A1 * | 11/2018 | Li | H04W 72/14 |
| 2019/0021132 A1 * | 1/2019 | Kyles | H04W 12/08 |
| 2019/0124598 A1 * | 4/2019 | Fakoorian | H04L 5/0035 |
| 2019/0215605 A1 * | 7/2019 | McCormack | H04R 3/00 |
| 2019/0260524 A1 * | 8/2019 | Nam | H04L 1/0045 |
| 2019/0296956 A1 * | 9/2019 | John Wilson | H04L 5/0048 |
| 2019/0297664 A1 * | 9/2019 | Kyles | H04B 1/401 |
| 2020/0014567 A1 * | 1/2020 | Kyles | H04L 25/0266 |

OTHER PUBLICATIONS

United States Office Action, U.S. Appl. No. 15/226,728, dated Jun. 16, 2017, 12 pages.

\* cited by examiner

EHF RECEIVER ARCHITECTURE WITH DYNAMICALLY ADJUSTABLE DISCRIMINATION THRESHOLD

CROSS REFERENCE TO RELATED APPLICATION

This application is a continuation of U.S. patent application Ser. No. 15/226,728, filed Aug. 2, 2016, which is incorporated by reference in its entirety.

BACKGROUND

Data receivers configured to capture and decode Extremely High Frequency (EHF) electromagnetic data signals often amplify the incoming data, and then convert it to baseband data. The resulting baseband signals may have varying amplitudes and varying amounts of jitter and duty cycle distortion. In some situations, these undesirable signal conditions may be exacerbated by manufacturing and environmental conditions.

Ideally, the representative amplitudes of the binary states of encoded data baseband data would be distinct. However, when noise is introduced into the signal, the encoded amplitude may no longer be distinct and may cause ambiguous decoding for different states. Received signals have varying power, which may cause inadequate separation between binary baseband data and/or additional third states, such as an idle state. Inadequate separation may also cause the encoded amplitude to no longer be distinct, also resulting in ambiguous decoding for different states. When the EHF data receiver cannot clearly determine whether a signal's voltage amplitude is a binary 0 or binary 1, the resulting baseband signals may be erroneous.

SUMMARY

The embodiments relate to an architecture of an EHF receiver that determines an initial discrimination threshold voltage level for classifying an incoming signal as a binary '1' or a binary '0', and dynamically adjusting the initial discrimination threshold voltage level to account for characteristics of the received EHF electromagnetic data signal. The architecture includes an amplifier, detector, adaptive voltage slicer, and controller. The amplifier includes one or more low-noise amplifiers (LNA) that receive the incoming EHF electromagnetic data signal from an EHF transmitting device and generates an amplified input signal. The gain applied to each of the LNAs may be dynamically adjusted based on the amplitude of the received EHF electromagnetic data signal. The detector includes a main detector and replica detector that convert the received EHF electromagnetic data signal into a baseband signal and a reference signal. The main detector generates the baseband signal representing the received EHF electromagnetic data signal, and the reference detector generates a reference signal corresponding to an upper limit of a desired discrimination threshold voltage level. The controller uses the main baseband signal to determine an initial discrimination threshold voltage level, and dynamically adjust the discrimination threshold and the gain settings of the LNAs during normal operation to compensate for changing signal conditions.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, the described embodiments may be practiced without these specific details. In other instances, well-known methods, procedures, components, circuits, and networks have not been described in detail so as not to unnecessarily obscure aspects of the embodiments.

Exemplary Receiver

Figure 1:
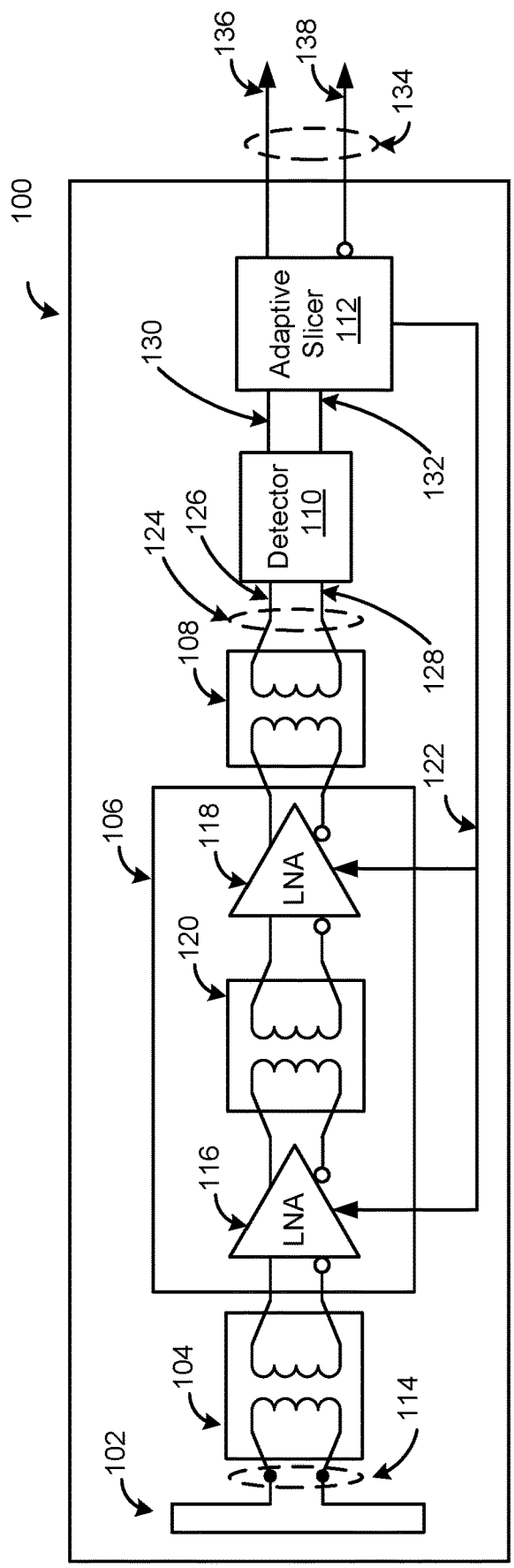
FIG. 1 is a high-level diagram of a receiver device, according to one embodiment.

FIG. 1 is a high-level diagram of a receiver device 100, according to one embodiment. In the embodiment shown in FIG. 1, receiver device 100 includes transducer 102, amplifier 106, transformer 108, detector 110, and adaptive voltage slicer 112. The transducer 102 receives the EHF electromagnetic data signal from a transmitting device and converts the electromagnetic energy into an electrical signal, such as a differential current signal 114. The received EHF electromagnetic data signal includes encoded binary data. An example encoding scheme includes Amplitude-Shift-Keying (ASK) modulation. Using ASK, a logic '1' is encoded with maximum EHF power level, a logic "0" is encoded with a partial EHF power level (e.g., 25%, or 37.5% of the "1" level). A third state, such as an idle state, may also be encoded to correspond to a predetermined number of consecutive periods of logic '0' lasting for more than a specified period of time when the baseband output is driven to a neutral (0V differential) state. Transformer 104 couples the electrical signal 114 to the input of amplifier 106.

In the embodiment shown in FIG. 1, amplifier 106 is a two stage amplifier formed by LNA 116 and LNA 118 coupled together by transformer 120. LNA 116 and LNA 118 embody the first and second stage of the two stage amplifier, respectively. LNA 116 includes a differential signal input corresponding to the input of the amplifier 106, a differential signal output coupled to a primary winding of transformer 120, and a gain control input. Exemplary LNA 116 may be any conventional amplifier configured to amplify a low power electromagnetic signal in the EHF band of the electromagnetic spectrum, while decreasing the signal-to-noise ratio by less than a factor of two. The gain of LNA 116 may be adjusted in accordance with gain control signal 122 supplied by adaptive voltage slicer 112. The gain adjustment, in one example, may be a factor of one hundred. LNA 118 operates in a manner similar to LNA 116, and includes a differential input coupled the secondary winding of transformer 120, a differential output, and a gain control input coupled to gain control signal 122. LNA 118 further amplifies the initially amplified EHF electromagnetic signal generated by LNA 116 and generates a final amplified EHF electromagnetic signal 124 corresponding to the output of amplifier 106. Final amplified EHF electromagnetic signal 124 is a differential signal including true and complement signals 126 and 128. The amount of gain applied to the initially amplified EHF electromagnetic signal by LNA 118 is determined in accordance with gain control signal 122. In an alternative embodiment, amplifier 106 may include more than or less than two LNAs.

The transformer 108 magnetically couples the output of LNA 118 from the primary winding of transformer 108 to the secondary winding of transformer 108. The input of detector 110 is coupled to the secondary winding of transformer 108. Detector 110 converts the final amplified EHF electromagnetic signal 124 into baseband signal 132 and reference signal 130, as further described with reference to FIG. 2.

Adaptive voltage slicer 112 receives baseband signal 132 and reference signal 130 and generates and adjusted amplified baseband signal 134 by employing an adaptive voltage slicing algorithm. The amplified baseband signal 134 is a differential signal including true and complement signals 136 and 138. The adaptive voltage slicing algorithm determines an initial discrimination threshold voltage level for classifying an incoming signal as a binary '1' or a binary '0' by computing a difference between baseband signal 132 and reference signal 130, and then dynamically adjusting the initial discrimination threshold voltage level as conditions of the received EHF electromagnetic signal change. Adaptive voltage slicer 112 may also employ the slicing algorithm to generate gain control signal 122 to regulate the gain applied to LNAs 116 and 118 to further adjust the discrimination threshold voltage level during active operation mode.

Figure 2:
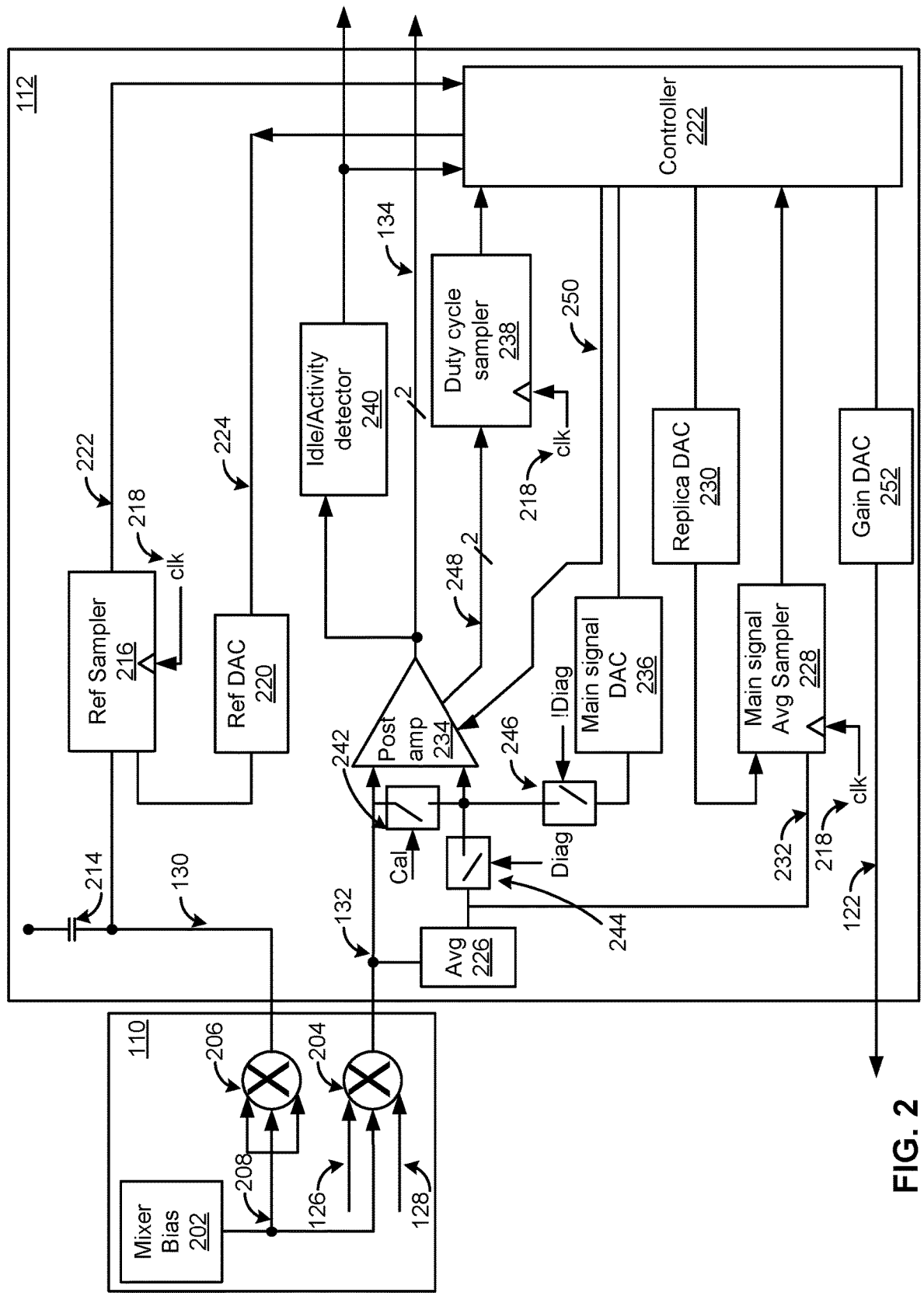
FIG. 2 is a block diagram illustrating components of the receiver device, according to one embodiment.

FIG. 2 is a block diagram illustrating certain components of the receiver device 100, according to one embodiment. Receiver device 100 includes, among other components, detector 110, and adaptive voltage slicer 112. In the embodiment shown in FIG. 2, the detector 110 includes mixer bias circuit 202, main signal mixer 204, and replica signal mixer 206. Mixer bias circuit 202 generates a direct current (DC) bias voltage, which is shared by main signal mixer 204 and replica signal mixer 206.

Main signal mixer 204 mixes the true and complement signals 126 and 128 of final amplified EHF electromagnetic signal 124 with the bias voltage 208 and generates baseband signal 132. Replica signal mixer 206 mixes bias voltage 208 together with itself and generates reference signal 130. Reference signal 130 indicates the voltage level when there is no incoming data energy. In one embodiment, reference signal 130 may contain voltage information but no actual data. In one embodiment, reference signal 130 may be set as the upper limit of the desired voltage level used by an adaptive slicing voltage algorithm to determine the optimal discrimination threshold voltage level. Reference signal 130 is used by controller 222 to provide a comparison point for a "no signal" level so that the amplitude of the received EHF electromagnetic signal can be sensed. The difference between reference signal 130 and baseband signal 132 may also be used by controller 222 to determine a baseline noise level.

Adaptive voltage slicer 112 includes a reference signal feedback loop, baseband signal feedback loop, post amplifier signal path, and gain setting feedback loop. The reference signal feedback loop is formed by sense capacitor 214, reference sampler 216, reference digital-to-analog converter (DAC) 220, and controller 222. Reference signal 130 may be sensed by capacitor 214 and sampled by reference sampler 216. Reference sampler 216 samples reference signal 130 and compares reference signal 130 to the output of reference DAC 220. The sample rate by which reference sampler 216 samples reference signal 130 is determined by sample clock 218. In the embodiment shown in FIG. 2, sample clock 218 has a 266 MHz clock rate. In other embodiments, the clock rate of sample clock 218 may be more than or less than 266 MHz. Reference DAC 220 may be a multi-bit DAC coupled to receive digital values from controller 222 corresponding to reference signal settings. In the embodiment shown in FIG. 2, Ref DAC 220 is an 8-bit DAC. The reference signal settings may be incrementally adjusted and converted by reference DAC 220 into corresponding analog values until the reference signal setting matches the value of reference signal 130.

Baseband signal feedback loop is formed by the output of main signal mixer 204, averaging circuit 226, main signal average sampler 228, replica DAC 230, and controller 222. Averaging circuit 226 receives baseband signal 132, determines the average amplitude of baseband signal 132, and generates average signal 232. The output of averaging circuit 226 may be coupled to one of the inputs of main signal average sampler 228 and one of the pair of differential inputs of post-amplifier 234 via switch 244. The operation of switch 244 is controlled by control signal DIAG, which is generated by controller 222. During diagnostic mode, the control signal DIAG has a first state that causes switch 244 to be closed. When switch 244 is closed, controller 222 determines the discrimination threshold voltage level directly from the average signal 232.

In one embodiment, averaging circuit 226 is embodied as a single pole resistor-capacitor (RC) filter. For example, one terminal of the resistor is coupled to the output of main signal mixer 204; the other terminal of the resistor is coupled to the anode of a capacitor. The anode of the capacitor is also coupled to switch 244 and main signal average sampler 228, while the cathode of the capacitor is coupled to ground. Main signal average sampler 228 receives average signal 232 output by averaging circuit 226, samples average signal 232, and compares average signal 232 to the output of replica DAC 230. The sample rate by which main signal average sampler 228 samples average signal 232 is determined by sample clock 218 in a similar manner to reference sampler 216. Replica DAC 230 may be a multi-bit DAC coupled to receive digital values from controller 222 corresponding to the average signal value setting. In the embodiment shown in FIG. 2, replica DAC 230 is an 8-bit DAC. The average signal value settings may be incrementally adjusted and converted by replica DAC 230 until the digital value supplied to replica DAC 230 matches the value of average signal 232.

The post amplifier signal path includes post-amplifier 234, main signal DAC 236, duty cycle sampler 238, and idle/activity detector 240. Post-amplifier 234 uses an initial or adjusted voltage decision level to determine the binary state (e.g., logic '0' or logic '1') of the input voltage to post-amplifier 234. During active operation mode, post-amplifier 234 compares baseband signal 132 with the reference signal setting value provided by main signal DAC 236 via switch 246. The difference between the voltage of baseband signal 132 and the reference signal setting value corresponds to an initial discrimination threshold voltage level. Using the initial discrimination threshold voltage level, post-amplifier 234 interprets the voltage level of baseband signal 132 as a logic '0' or a logic '1.' Main signal DAC 236 may be a multi-bit DAC coupled to receive digital values from controller 222 corresponding to the reference signal settings. In the embodiment shown in FIG. 2, main signal DAC 236 is an 8-bit DAC. The reference signal settings may be adjusted by controller 222 to track an updated reference signal setting. Main signal DAC 236 converts the reference signal setting into an analog value used by post-amplifier 234 to apply the determined discrimination threshold voltage level to baseband signal 132.

The post amplifier signal path also includes post amplifier offset feedback loop that includes static offset link 250, duty cycle sampler 238, and controller 222. During calibration operation mode, the inputs of post-amplifier 234 are nulled using switch 242 and calibration control signal generated by controller 222. The result of the post amplifier offset voltage setting is sampled at the filtered output 248 and received by duty cycle sampler 238. Filtered output 248 provides true and complement filtered outputs corresponding to the average voltage of the true and complement outputs of post-amplifier 234. The average voltage closely approximates a DC voltage indicative of the duty cycle of the data. Duty cycle sampler 238 samples the difference between the true and complement filtered outputs and counts the number of occurrences of a logic '1' or a logic '0.' The difference information and number of occurrences of a logic '1' or a logic '0' is provided to controller 222 for computing a measure of the duty cycle of amplified baseband signal 134. Controller 222 may in turn, dynamically adjust the discrimination threshold voltage level at the input of post-amplifier 234 to drive to a balanced duty cycle of amplified baseband signal 134 during active operation mode.

The post amplifier signal path further includes idle/activity detector 240, which receives amplified baseband signal 134 and detects specified protocol-specific run lengths of consecutive logic '0's to determine an idle state or interruption in the flow of received data. In one embodiment, idle/activity detector 240 includes a differential-to-single-ended converter and an activity detector circuit. The differential-to-single-ended converter is configured to convert differential amplified baseband signal 134 to a single-ended signal. In one embodiment, the differential-to-single-ended converter may be a conventional high-speed input-output circuit configured to convert a differential signal to a single-ended signal. Activity detector circuit may be a conventional circuit configured to detect distinct logic or voltage levels in a serial signal and detect the duration that a certain logic level or voltage level is present in the serial signal. Idle/activity detector 240 generates an "EHF idle" signal when it detects a specified logic level present for a specified duration. The specified logic level and specified duration depend upon the particular protocol of baseband signal 132. For example, for Universal Serial Bus (USB) 3.X, idle activity detector 240 generates an EHF idle signal when a logic level of '0' is detected for greater than a predetermined number of clock cycles or time, such as 14 clock cycles or 50 ns.

Example Process for Performing Calibration

Figure 3:
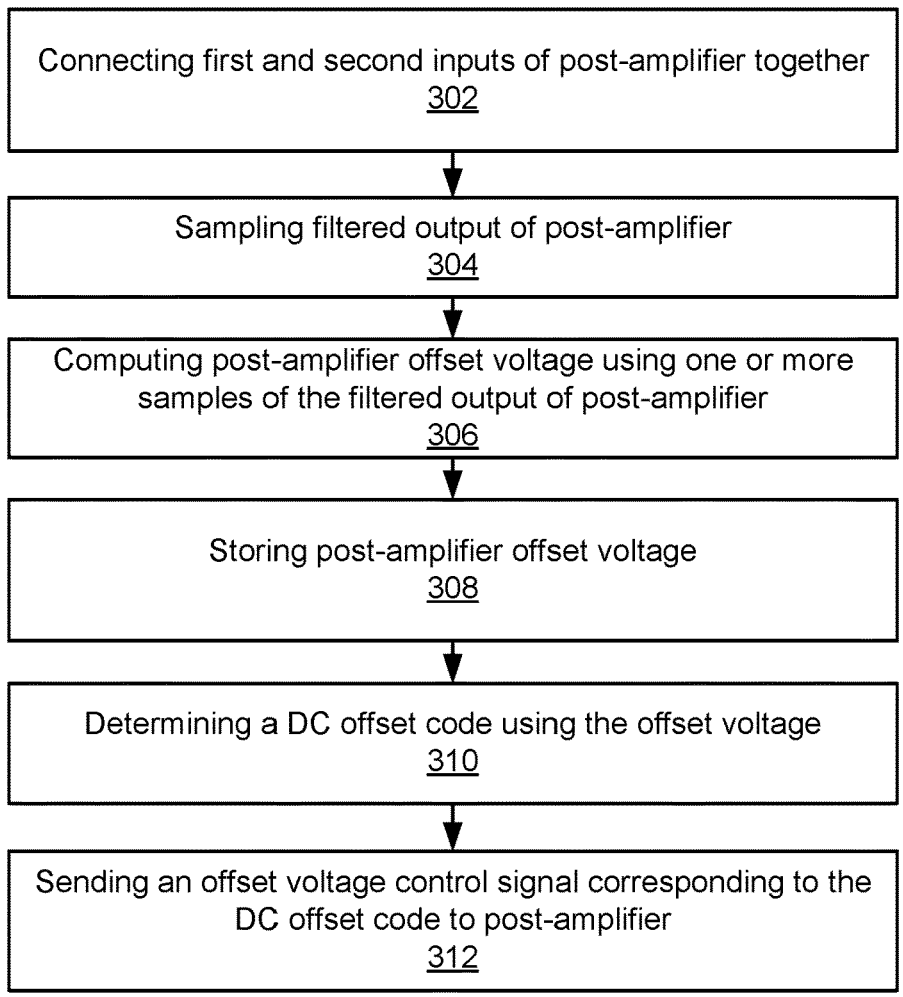
FIG. 3 illustrates a flowchart for determining calibration settings for post amplifier offset nulling, according to one embodiment.

FIG. 3 illustrates a flowchart for determining calibration settings for post amplifier offset nulling, according to one embodiment. Note that in other embodiments, steps other than those shown in FIG. 3 may be performed.

The adaptive slicing algorithm employed by adaptive voltage slicer 112 performs at least three operation modes including calibration, idle, and active. During calibration operation mode, the adaptive slicing algorithm performs post-amplifier 234 offset nulling and replica signal mixer 206 to main signal mixer 204 mismatch calibration.

In the embodiment shown in FIG. 3, the algorithm performs post-amplifier 234 offset nulling to account for differences between the different input transistors of post-amplifier 234. Controller 222 generates a calibration control signal having a first state to cause switch 242 to close, shorting together 302 the inputs of post-amplifier 234. With 0V applied across the differential inputs of post-amplifier 234, post-amplifier 234 generates a non-0V output voltage signal corresponding to an offset voltage. The output voltage signal may be sampled 304 by duty cycle sampler 238 and sent to controller 222 as true and complement filtered outputs 248.

Controller 222 computes 306 a post-amplifier 234 offset voltage from the sampled filtered output voltage signal. For example, controller 222 may compute 306 the offset voltage by integrating multiple samples of the filtered output voltage signal over a specified time period. Controller 222 may use other conventional methods to compute the offset voltage from the sampled values of true and complement components of filtered output 248. Controller 222 stores 308 the computed offset voltage in a memory device or component accessible by controller 222.

Controller 222 converts 310 the computed offset voltage into a DC offset code. The DC offset code may be embodied as a digital representation of the computed offset voltage. Controller 222 sends 312 an offset control signal to post-amplifier 234 using static offset link 250. The offset control signal includes information that corresponds to the value of the stored offset voltage. In one embodiment, the information may be a resistance value to be applied to an adjustable resistance coupled between offset null inputs (not shown) of post-amplifier 234. In other embodiments, the information may be a voltage or current value.

Figure 4:
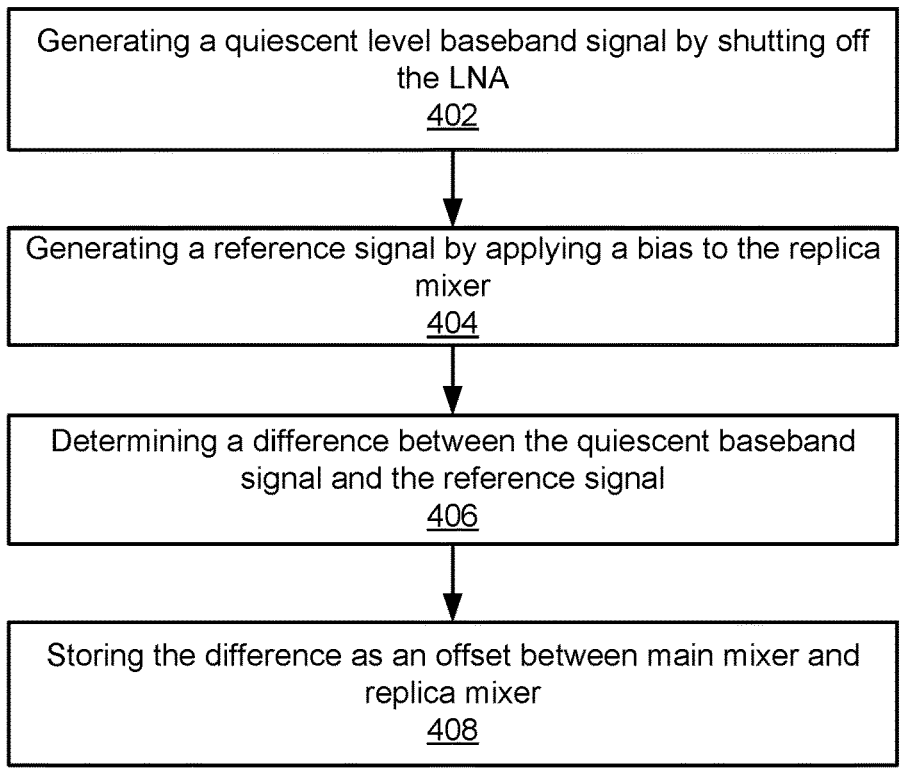
FIG. 4 illustrates a flowchart for performing replica signal mixer to main signal mixer mismatch calibration, according to one embodiment.

FIG. 4 illustrates a flowchart for performing replica signal mixer 206 to main signal mixer 204 mismatch calibration, according to one embodiment. Note that in other embodiments, steps other than those shown in FIG. 4 may be performed.

Generally, the same signal propagating through both main signal mixer 204 and replica signal mixer 206 would ideally track each other. Due to mismatches between transistors in the respective mixers, the same signals propagating through main signal mixer 204 and replica signal mixer 206 do not match each other. The resulting incoming and outgoing signals propagating through main signal mixer 204 and replica signal mixer 206, thus exhibit different characteristics.

In the embodiment shown in FIG. 4, the adaptive slicing algorithm performs replica signal mixer 206 to main signal mixer 204 mismatch calibration to account for differences the transistors included in main signal mixer 204 and replica signal mixer 206.

To perform the replica signal mixer 206 to main signal mixer 204 mismatch calibration, controller 222 disables LNAs 116 and 118. Main signal mixer 204 included in detector 110 mixes EHF electromagnetic signals 126 and 128 with bias voltage 208, generating 402 a quiescent level baseband signal 132. Replica signal mixer 206 included in detector 110 mixes 404 two predetermined bias voltages 208 together, generating reference signal 130. Reference signal 130 represents the voltage level when there is no actual data present. Controller 222 detects baseband signal 132 and reference signal 130 and determines 406 the voltage difference between the quiescent signal and the reference signal. Controller 222 stores 408 the voltage difference as a mixer mismatch offset value. Controller 222 may use the stored offset value to reduce the need for repeatedly performing offset voltage calibration.

Figure 5:
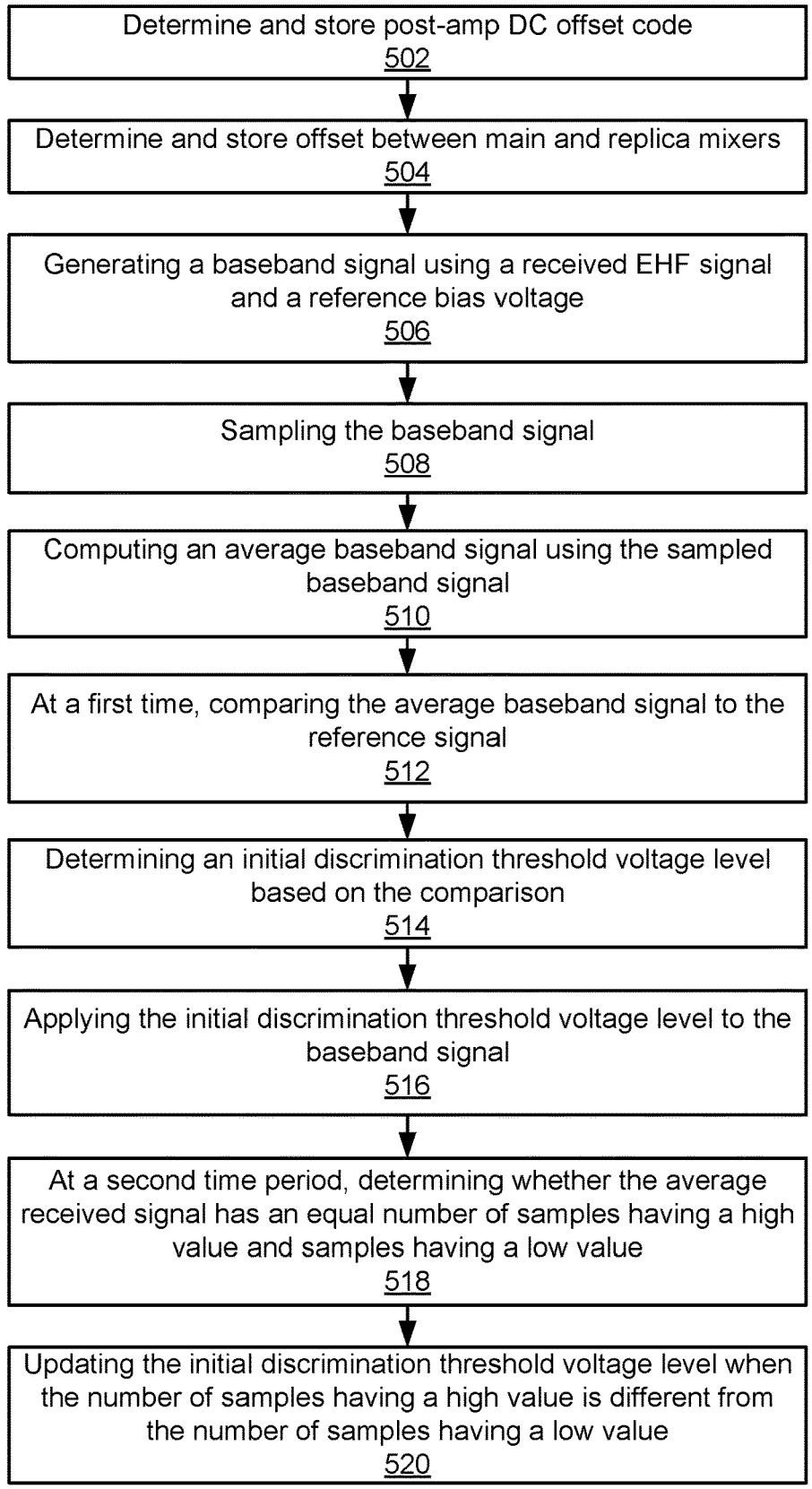
FIG. 5 illustrates a flowchart for determining an initial discrimination threshold voltage level and dynamically adjusting the discrimination threshold based on signal conditions, according to one embodiment.

Example Process for Determining and Adjusting Discrimination Threshold Voltage Level FIG. 5 illustrates a flowchart for determining a discrimination threshold voltage level and dynamically adjusting the discrimination threshold voltage level based on signal conditions, according to one embodiment. Note that in other embodiments, steps other than those shown in FIG. 5 may be performed.

The adaptive slicing algorithm employed by adaptive voltage slicer 112 determines a discrimination threshold voltage level so that post-amplifier 234 may correctly determine a binary state of baseband signal 132 and amplify the corresponding signal. In the embodiment shown in FIG. 6, prior to determining the initial discrimination threshold voltage level, controller 222 determines and stores 502 a post-amplifier DC offset code, and determines and stores 504 an offset between the main signal mixer 204 and replica signal mixer 206, in accordance with FIG. 3 and FIG. 4, respectively.

Detector 110 generates 506 baseband signal 132 by mixing EHF electromagnetic signals 126 and 128 with bias voltage 208. Averaging circuit 226 generates an average baseband signal 232, which is sampled 508 by main signal average sampler 228. In one embodiment, controller 222 computes 510 an average baseband signal 232 by integrating the sampled values over a specified period of time. In other embodiments, controller 222 compute 510 an average baseband signal 232 from the sampled version of baseband signal 132 using other conventional methods.

During a first time period, controller 222 compares 512 the average baseband signal 232 and the reference signal value corresponding to the value of the stored reference setting. Controller 222 determines 514 an initial discrimination threshold voltage level based on the comparison. For example, controller 222 may set the initial discrimination threshold voltage level to a voltage value corresponding to the difference between the reference signal value and the average baseband signal 232. Controller 222 stores a digital representation of the initial discrimination threshold voltage level and provides it to main signal DAC 236. Main signal DAC 236 converts the digital representation of the initial discrimination threshold voltage level into a corresponding analog voltage signal. Post-amplifier 234 receives the output of main signal DAC at a first input and receives baseband signal 132 at a second input. The output of main signal DAC 236 operates as a reference voltage to post-amplifier 234 to set the discrimination threshold voltage level.

Once an initial discrimination threshold voltage level has been determined by controller 222, controller 222 may continue to apply 516 the initial discrimination threshold voltage level to baseband signal 132. Alternatively, controller 222 may use the initial discrimination threshold voltage level as a starting point to dynamically adjust the discrimination threshold voltage level to changing conditions. For example, at a second time period subsequent to the first time period, controller 222 determines 518 whether the average baseband signal 232 has an equal number of samples having a high value and samples having a low value. Main signal average sampler 228 samples the average baseband signal 232 value at a specified time interval in accordance with the rate of clock signal 218. If controller 222 detects an unequal number of samples having a high value compared to samples having a low value, controller 222 adjusts the discrimination threshold voltage level to account for the signal conditions.

For example, controller 222 loads the initial value of the discrimination threshold voltage level into replica DAC 230 and incrementally adjusts its value until the number of samples having a high value compared to the number of samples having a low value are equal. When the number of number of samples having a high value are equal to the number of samples having a low value, controller 222 updates 520 the stored initial discrimination threshold voltage level with the adjusted discrimination threshold voltage threshold value written to replica DAC 230. Steps 518 and 520 may be continually repeated during active operation. Main signal feedback loop may continuously monitor and dynamically adapt the discrimination threshold voltage level to optimal levels depending on the signal conditions.

The initial discrimination threshold voltage level may be maintained and the adaptive slicing algorithm continues to adapt and optimize the discrimination threshold voltage level value applied to incoming signals. In idle states, receiver device 100 may use the last known good discrimination threshold voltage level value and maintain the last known good value during the idle state. Alternatively, the idle state may maintain the initial discrimination threshold voltage level during idle. Generally, idle level adaptation will not continue in idle. The gain control loops, discussed below, continue as described above during idle states.

In one embodiment, during active operation mode, the adaptive slicing algorithm employed by adaptive voltage slicer 112 adjusts the discrimination threshold voltage level to correct imbalances in filtered output 248 of post-amplifier 234. Duty cycle sampler 238 samples the difference between the true and complement filtered output 248. Controller 222 receives the samples and counts the number of occurrences of a logic '1' or logic '0.' Based on the count, controller 222 determines a measure of the duty cycle of amplified baseband signal 134. For example, controller 222 may count equal number of samples having logic '1' state and having a logic '0' state during specified time period, which indicates that amplified baseband signal 134 has a 50% duty cycle. When the duty cycle is more than or less than 50%, the adaptive slicing voltage algorithm dynamically adjusts the discrimination threshold voltage level at the input of post-amplifier 234 to generate a signal having a balanced duty cycle at the output of the post-amplifier 234. For example, controller 222 may incrementally adjust the values written to main signal DAC 236 until the count of samples having logic '1' state and the count of samples having a logic '0' state during specified time period indicates that amplified baseband signal 134 has a 50% duty cycle. At which point, controller 222 stores the adjusted discrimination threshold voltage level setting applied to main signal DAC 236 as the updated discrimination threshold voltage level setting.

In one embodiment, once the adaptive slicing algorithm determines an initial discrimination threshold voltage level, the algorithm may choose to maintain the discrimination threshold voltage level at a particular level and allow for maintaining an appropriate default or last-known-good discrimination threshold voltage level. In which case, the initial discrimination threshold voltage level may be the reference discrimination threshold voltage level. In one implementation, the ability to maintain a discrimination threshold voltage level may be beneficial when baseband signal 132 is interrupted or in an idle state. In order to do this, the idle/activity detector 240 tracks incoming signal during idle to adapt to changes in signal strength. During idle, even if there is no data, idle/activity detector 240 may track characteristics of the carrier. For example, during an idle state, the discrimination threshold voltage level settles to a logic '0' level since the incoming signal is all '0's.' Controller 222, in turn, calculates an adjusted discrimination threshold voltage level based on the detected level of the incoming signal during the idle state. This allows the receiver circuit 100 to obtain information about whether the transmitter is emitting signal and/or if there are signal characteristic changes.

Example Process for Dynamically Adjusting Amplifier Gain

Figure 6:
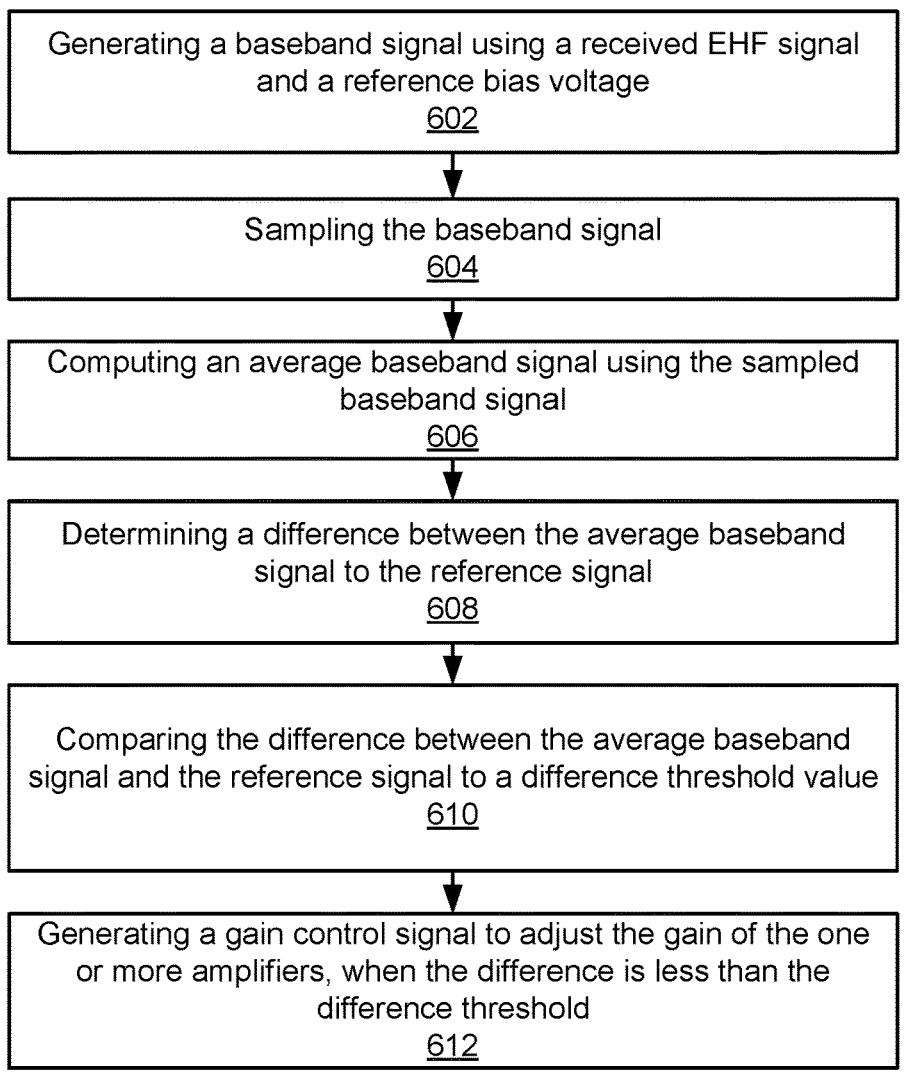
FIG. 6 illustrates a flowchart for dynamically adjusting amplifier gain, according to one embodiment The figures depict, and the detail description describes, various non-limiting embodiments for purposes of illustration only.

FIG. 6 illustrates a flowchart for dynamically adjusting amplifier 106 gain, according to one embodiment. Note that in other embodiments, steps other than those shown in FIG. 6 may be performed.

The adaptive slicing algorithm employed by adaptive voltage slicer 112 continuously monitors the differences between a stored reference value setting and the detected baseband signal to ascertain the size of the detected baseband signal. The algorithm may then drive gain DAC 252 to provide analog gain control voltages to the LNAs 116 and 118 included in amplifier 106 to dynamically change the signal amplitudes to the desired levels.

During active operation mode, detector 110 generates 602 baseband signal 132 by mixing EHF electromagnetic signals 126 and 128 with bias voltage 208. Averaging circuit 226 generates an average baseband signal 232, which is sampled 604 by main signal average sampler 228. In one embodiment, controller 222 computes 606 an average baseband signal 232 by integrating the sampled values over a specified period of time. In other embodiments, controller 222 may compute 606 average baseband signal 232 from the sampled version of baseband signal 132 using other conventional methods.

Controller 222 determines 608 the difference between the average baseband signal 232 and the reference signal value corresponding to the value of the stored reference setting. Controller 222 then compares 610 the difference between average baseband signal 232 and the reference signal value to a difference threshold value corresponding to a target difference between the reference voltage and the average voltage of baseband signal 132. The difference threshold may be previously specified during manufacturing or test, or may be set during normal operation of the receiver 100. In one embodiment, the difference threshold corresponds to the target half amplitude of baseband signal 132. When controller 222 determines that the difference between the average baseband signal 232 and the reference signal value indicates that the baseband signal is too large, controller 222 generates 612 a gain control signal 122 to adjust the gain of the LNAs 116 and 118 downwards, and when the baseband signal is too small, controller 222 adjusts gain control signal 122 to adjust the gain of LNAs 116 and 118 upwards.

In another embodiment, controller 222 may adjust the gain level of one or a combination of LNA 116 and 118 by comparing reference signal 130 generated by replica signal mixer 206 and baseband signal 132 generated by main signal mixer 204. Controller 222 may store a predetermined difference between reference signal 130 and baseband signal 132. When the difference exceeds or is below a predetermined threshold, controller 222 may decrease or increase the gain applied to one or a combination of LNA 116 and 118. Controller 222 may increase LNA gain until the signal power is high enough as described with reference to step 612.

The foregoing description, for purpose of explanation, has been described with reference to specific embodiments. However, the illustrative discussions above are not intended to be exhaustive or to limit the disclosed embodiments to the precise forms disclosed. Many modifications and variations are possible in view of the above teachings. The embodiments were chosen and described in order to best explain the principles of the disclosed embodiments and its practical applications, to thereby enable others skilled in the art to best use the disclosed embodiments with various modifications as are suited to the particular use contemplated.

Finally, the language used in the specification has been principally selected for readability and instructional purposes, and it may not have been selected to delineate or circumscribe the inventive subject matter. It is therefore intended that the scope of the disclosed embodiments be limited not by this detailed description, but rather by any claims that issue on an application based hereon. Accordingly, the disclosure of the embodiments is intended to be illustrative, but not limiting, of the scope of the disclosed embodiments, which is set forth in the following claims.

What is claimed is:

1. A receiver device comprising:
   a detector circuit configured to generate a baseband signal using an extremely high frequency (EHF) electromagnetic signal received by the receiver device; and
   a voltage slicer circuit connected to the detector circuit, the voltage slicer circuit configured to:
      compute an average of the baseband signal using the baseband signal;
      generate samples of the average baseband signal, the samples including a first number of samples having a high value responsive to the average baseband signal being greater than a discrimination threshold voltage level and a second number of samples having a low value responsive to the average baseband signal being less than the discrimination threshold voltage level; and
      adjust the discrimination threshold voltage level until the first number of samples is equal to the second number of samples.

2. The receiver device of claim 1, wherein:
   the voltage slicer circuit includes a memory configured to store a discrimination threshold voltage level setting corresponding with the discrimination threshold voltage level; and
   the voltage slicer is configured to:
      generate the discrimination threshold voltage from the discrimination threshold voltage level setting stored in the memory for comparison with the average baseband signal to determine the first number of samples and the second number of samples; and
      store an adjusted discrimination threshold voltage level setting corresponding with the adjusted discrimination threshold voltage level in the memory.

3. The receiver device of claim 1, wherein the voltage slicer circuit is further configured to:
   compute a second average baseband signal;
   generate second samples of the second average baseband signal, the second samples including a third number of samples having the high value responsive to the second average baseband signal being greater than the adjusted discrimination threshold voltage level and a fourth number of samples having the low value responsive to the second average baseband signal being less than the adjusted discrimination threshold voltage level; and
   adjust the adjusted discrimination threshold voltage level until the third number of samples is equal to the fourth number of samples.

4. The receiver device of claim 1, wherein the voltage slicer circuit includes a post-amplifier configured to compare the baseband signal with the discrimination threshold voltage level to determine binary states of the baseband signal, the post-amplifier including a first input transistor that receives the baseband signal and a second transistor that receives the discrimination threshold voltage level.

5. The receiver device of claim 4, wherein in a calibration mode of the receiver device the voltage slicer circuit is further configured to:
determine an offset voltage between the first and second input transistors of the post-amplifier; and
provide the offset voltage to the post-amplifier.

6. The receiver device of claim 5, wherein the post-amplifier is further configured to:
responsive to the first and second transistors being connected, generate an output voltage signal indicating the offset voltage in the calibration mode; and
compare the baseband signal with the discrimination threshold voltage level using the offset voltage responsive to receiving the offset voltage.

7. The receiver device of claim 1, wherein the detector circuit includes:
a main signal mixer configured to generate the baseband signal by mixing the EHF electromagnetic signal with a bias voltage; and
a replica signal mixer configured to generate an initial reference signal by mixing the bias voltage with another bias voltage.

8. The receiver device of claim 7, wherein:
the voltage slicer circuit is further configured to generate an adjusted reference signal by:
comparing the initial reference signal to a second reference signal generated from a reference signal setting stored in a memory;
adjusting the reference signal setting to match the second reference signal with the initial reference signal; and
generating the adjusted reference signal using the adjusted reference signal setting; and
the voltage slicer circuit is further configured to determine the discrimination threshold voltage level using a difference between the average baseband signal and the adjusted reference signal.

9. The receiver device of claim 8, further comprising an amplifier circuit configured to receive an EHF electromagnetic signal and apply one or more gains to the EHF electromagnetic signal.

10. The receiver device of claim 9, wherein the voltage slicer circuit is further configured to:
compare a difference between the average baseband signal and the adjusted reference signal to a difference threshold value corresponding to a target difference between the average baseband signal and the adjusted reference signal; and
adjust the one or more gains of the amplifier circuit in response to the comparison of the difference threshold value and the difference between the average baseband signal and the adjusted reference signal.

11. The receiver device of claim 7, wherein:
the receiver device further includes an amplifier circuit configured to receive the EHF electromagnetic signal and apply one or more gains to the EHF electromagnetic signal; and
in a calibration mode of the receiver device:
the amplifier circuit is disabled;
the main signal mixer is further configured to generate a quiescent level baseband signal by mixing the EHF electromagnetic signal with the bias voltage without application of the one or more gains;
the replica signal mixer is further configured to generate a calibration reference by mixing the bias voltage with another bias voltage; and
the voltage slicer circuit is further configured to:
determine a voltage difference between the quiescent level baseband signal and the calibration reference signal; and
store the voltage difference as a mixer mismatch offset value for the main signal mixer and the replica signal mixer.

12. In a receiver device, a method comprising:
generating a baseband signal using an extremely high frequency (EHF) electromagnetic signal received by the receiver device;
computing an average of the baseband signal using the baseband signal;
generate samples of the average baseband signal, the samples including a first number of samples having a high value responsive to the average baseband signal being greater than a discrimination threshold voltage level and a second number of samples having a low value responsive to the average baseband signal being less than the discrimination threshold voltage level; and
adjusting the discrimination threshold voltage level until the first number of samples is equal to the second number of samples.

13. The method of claim 12, further comprising:
storing a discrimination threshold voltage level setting corresponding with the discrimination threshold voltage level in a memory;
generating the discrimination threshold voltage from the discrimination threshold voltage level setting stored in the memory for comparison with the average baseband signal to determine the first number of samples and the second number of samples; and
responsive to adjusting the discrimination threshold voltage level, storing an adjusted discrimination threshold voltage level setting corresponding with the adjusted discrimination threshold voltage level in the memory.

14. The method of claim 12, further comprising:
computing a second average baseband signal;
generating second samples of the second average baseband signal, the second samples including a third number of samples having the high value responsive to the second average baseband signal being greater than the adjusted discrimination threshold voltage level and a fourth number of samples having the low value responsive to the second average baseband signal being less than the adjusted discrimination threshold voltage level; and
adjusting the adjusted discrimination threshold voltage level until the third number of samples is equal to the fourth number of samples.

15. The method of claim 12, further comprising, by a post-amplifier of the receiver device:
receiving the baseband signal at a first input transistor of the post-amplifier;
receiving the discrimination threshold voltage level at a second input transistor of the post-amplifier; and
comparing the baseband signal with the discrimination threshold voltage level to determine binary states of the baseband signal.

16. The method of claim 15, further comprising, in a calibration mode of the receiver device:
determining an offset voltage between the first and second input transistors of the post-amplifier; and
providing the offset voltage to the post-amplifier.

17. The method of claim 16, further comprising, by the post-amplifier:
responsive to the first and second transistors being connected, generating an output voltage signal indicating the offset voltage in the calibration mode; and
comparing the baseband signal with the discrimination threshold voltage level using the offset voltage responsive to receiving the offset voltage.

18. The method of claim 12, further comprising:
generating the baseband signal by mixing the EHF electromagnetic signal with a bias voltage; and
generating an initial reference signal by mixing the bias voltage with another bias voltage.

19. The method of claim 18, further comprising:
generating an adjusted reference signal by:
comparing the initial reference signal to a second reference signal generated from a reference signal setting stored in a memory;
adjusting the reference signal setting to match the second reference signal with the initial reference signal; and
generating the adjusted reference signal using the adjusted reference signal setting; and
determining the discrimination threshold voltage level using a difference between the average baseband signal and the adjusted reference signal.

20. The method of claim 19, further comprising:
applying one or more gains to the EHF electromagnetic signal;
comparing a difference between the average baseband signal and the adjusted reference signal to a difference threshold value corresponding to a target difference between the average baseband signal and the adjusted reference signal; and
adjusting the one or more gains in response to the comparison of the difference threshold value and the difference between the average baseband signal and the adjusted reference signal.

* * * * *